US006456522B1

(12) United States Patent
Feurle et al.

(10) Patent No.: US 6,456,522 B1
(45) Date of Patent: Sep. 24, 2002

(54) INTEGRATED MEMORY HAVING MEMORY CELLS AND BUFFER CAPACITORS

(75) Inventors: Robert Feurle, Neubiberg; Dominique Savignac, Ismaning, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/953,729

(22) Filed: Sep. 17, 2001

(30) Foreign Application Priority Data

Sep. 15, 2000 (DE) .......................................... 100 45 692

(51) Int. Cl.⁷ .................................................. G11C 7/00

(52) U.S. Cl. ....................................... 365/149; 365/210

(58) Field of Search ................................ 365/149, 210, 365/206, 63

(56) References Cited

FOREIGN PATENT DOCUMENTS

| DE | 197 55 737 A1 | 7/1999 |
|---|---|---|
| WO | WO 81/00791 | 3/1981 |

*Primary Examiner*—Vu A. Le
(74) *Attorney, Agent, or Firm*—Laurence A. Greenberg; Werner H. Stemer; Ralph E. Locher

(57) ABSTRACT

An integrated memory includes memory cells each having a selector transistor and a storage capacitor. In each memory cell, the storage capacitor is connected to one of a plurality of column lines through the selector transistor, and a control terminal of the selector transistor is connected to one of a plurality of row lines. Buffer capacitors are each connected to a contact to another one of the column lines. The buffer capacitors are disposed in such a way that a connection between the respective buffer capacitor and the contact is disposed parallel to another one of the row lines. As a result, a permanently high dielectric strength is ensured through the use of the buffer capacitors.

5 Claims, 2 Drawing Sheets

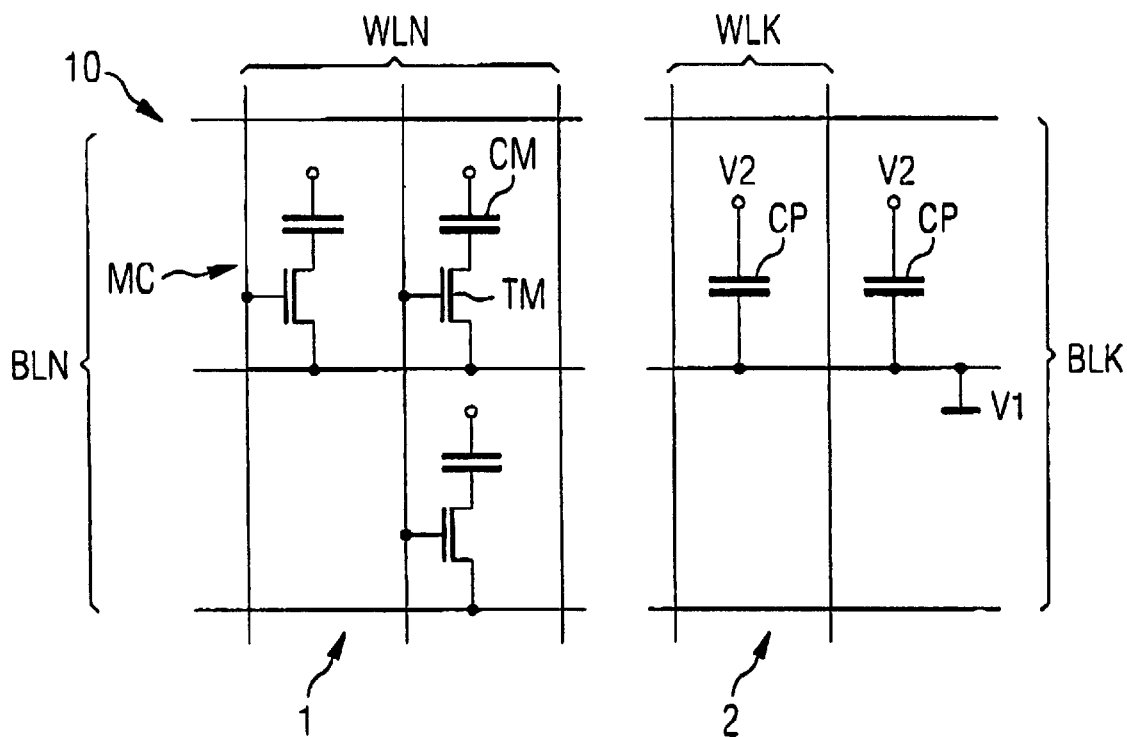
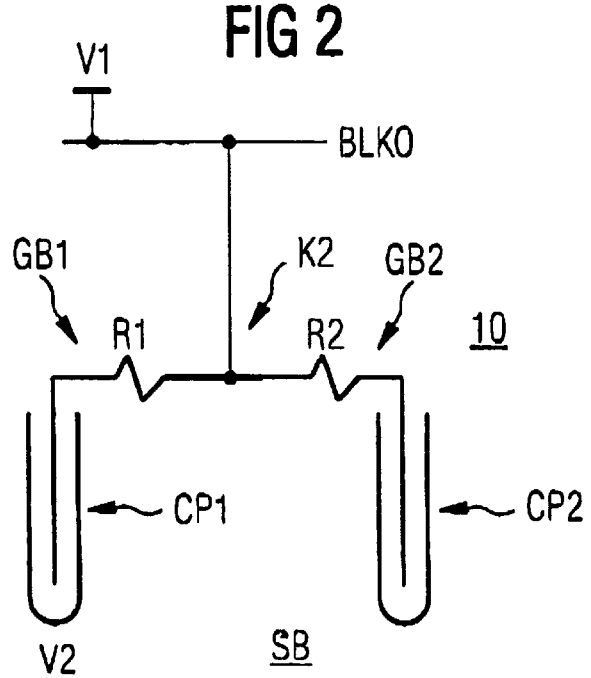

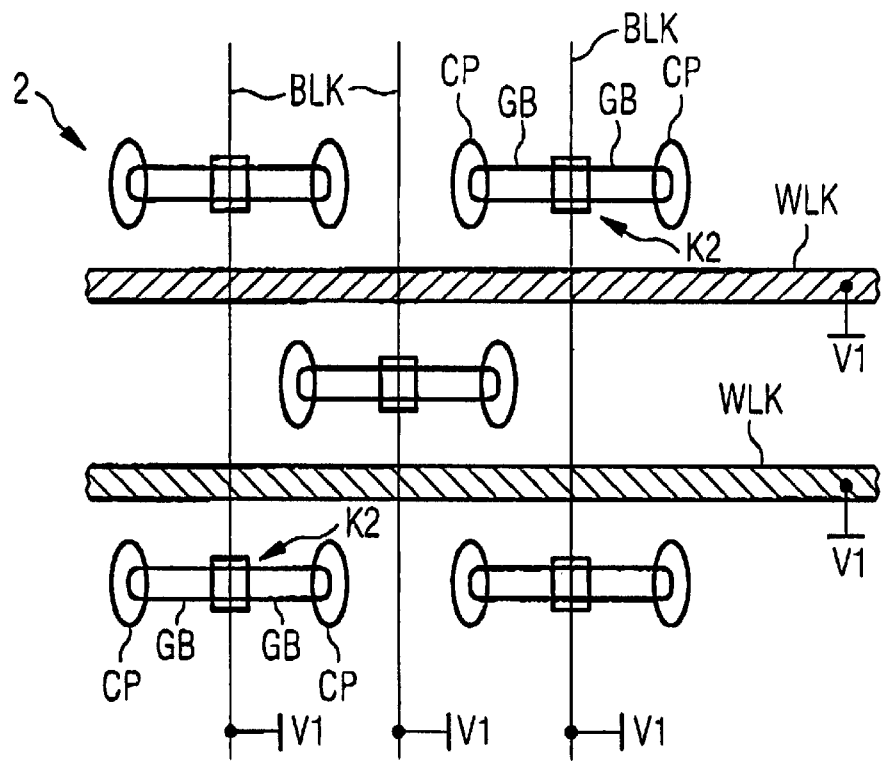
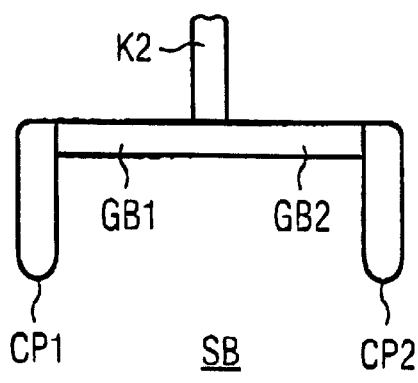
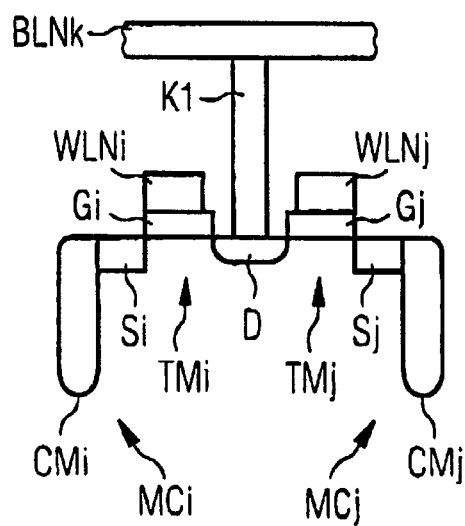

INTEGRATED MEMORY HAVING MEMORY CELLS AND BUFFER CAPACITORS

BACKGROUND OF THE INVENTION

Field of the Invention

The present invention relates to an integrated memory having memory cells and buffer capacitors. Integrated memories, such as those referred to as DRAM memories, for example, usually have memory cells each containing a selector transistor and a storage capacitor. The storage capacitors thereof are each connected through a respective selector transistor to one of a plurality of column lines of a matrix-shaped memory cell array. Control terminals of the respective selector transistors are each connected to one of a plurality of row lines, through which the memory cells can be selected.

In addition, such memories often have so-called buffer capacitors for stabilizing a voltage supply on the memory chip. They serve, in particular, to filter voltage peaks and thus ensure a certain level of dielectric strength of the memory. In the interest of largely homogeneous area coverage on the memory chip, buffer capacitors are frequently constructed and disposed in a similar way to the memory cells or their storage capacitors. This means that in that case the buffer capacitors also have a respectively assigned selector transistor. In such a case they are usually disposed in a region of the periphery of the memory chip. That region also has a structure similar to the memory cell array, for reasons of homogeneous area coverage. A homogeneous area coverage on the memory chip provides, in particular, advantages for the manufacture of the chip, for example improved planarization properties.

In order to activate the buffer capacitors permanently, the corresponding selector transistor is to be switched on permanently. Since the selector transistors generally age more quickly when permanently loaded, and as a result can become faulty more quickly than the buffer capacitors, their operational capability can thus be adversely affected relatively quickly. Furthermore, short circuits can occur in the selector transistors between their respective control terminals and their controlled paths. Those short circuits can arise, for example, due to inconsistent or faulty fabrication processes. If a selector transistor has a short circuit, the operational capability of the associated buffer capacitor is thus also adversely affected. The dielectric strength of the memory chip as a whole is thus adversely affected since generally no corresponding redundancy is provided for the buffer capacitors in such memory chips.

SUMMARY OF THE INVENTION

It is accordingly an object of the invention to provide an integrated memory having memory cells and buffer capacitors, which overcomes the hereinafore-mentioned disadvantages of the heretofore-known devices of this general type, which has largely homogeneous area coverage and in which a comparatively high dielectric strength can be produced permanently through the use of the buffer capacitors.

With the foregoing and other objects in view there is provided, in accordance with the invention, an integrated memory, comprising a plurality of column lines and a plurality of row lines. Memory cells each have a selector transistor and a storage capacitor connected through the selector transistor to one of the column lines. The selector transistor has a control terminal connected to one of the row lines. Contacts are each connected to another of the column lines. Buffer capacitors are disposed in such a way that connections between a respective one of the buffer capacitors and one of the contacts are each disposed parallel to another of the row lines.

The buffer capacitors are disposed, for example, in a region of the periphery of the memory chip. In the interest of homogeneous area coverage, this region has a structure similar to a memory cell array in which the memory cells are located. This means that this region also has column lines and row lines, with the buffer capacitors each being connected to a contact to one of these column lines. The column lines are connected, for example, to a terminal for a first potential of a voltage supply, and the respective buffer capacitors are connected to a terminal for a second potential of the voltage supply. This means that the buffer capacitors serve to equalize voltage peaks between the first potential and the second potential of the voltage supply.

Since both the memory cell array in which the memory cells are disposed and the region in which the buffer capacitors are disposed have column lines and row lines, largely homogeneous area coverage is ensured. The row lines and column lines of the memory cell array serve to select or to read or to write to the memory cells, the column lines and row lines in the region in which the buffer capacitors are disposed and serve to produce a necessary dielectric strength of the memory chip.

The connection between the respective buffer capacitor and the contact to the respective column line is to he produced parallel to one of the row lines. By virtue of this fact, when the memory chip is manufactured, a diffusion series resistor can be produced between the respective buffer capacitor and the contact. This means that the respective buffer capacitor and the contact are not connected to one another through a selector transistor. This results, in particular, in the advantage that as a result of the absence of the selector transistor, the error mechanisms of such a transistor also cannot influence the operational capability of the buffer capacitors. This ensures a comparatively high dielectric strength of the memory chip as a result of the buffer capacitors.

A further advantage of the invention is that the respective row lines do not have to be operated in a (permanently) active state to select the corresponding buffer capacitors. Since the respective row lines do not perform any selection function with respect to the buffer capacitors, those row lines can be connected to the same potential as the column lines connected to the buffer capacitors. As a result, those row lines and column lines are at the same potential. Therefore, no leakage current occurs if there is a short circuit between the respective lines.

According to one advantageous embodiment of the invention, the buffer capacitors have an identical geometric structure to the storage capacitors. In addition to largely homogenizing area coverage, this also simplifies the manufacturing process because only one type or structure of capacitor is provided, for example in the form of a trench capacitor.

Other features which are considered as characteristic for the invention are set forth in the appended claims.

Although the invention is illustrated and described herein as embodied in an integrated memory having memory cells and buffer capacitors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic circuit diagram illustrating the structure of an integrated memory having memory cells and buffer capacitors;

FIG. 2 is a circuit diagram showing the wiring of two buffer capacitors;

FIG. 3 is a fragmentary, plan view of an integrated memory having buffer capacitors;

FIG. 4 is a fragmentary, cross-sectional view of two buffer capacitors; and

FIG. 5 is a fragmentary, cross-sectional view of two memory cells.

DESCRIPTION OF THE PREFERRED EMBODIMENTS

Referring now to the figures of the drawings in detail and first, particularly, to FIG. 1 thereof, there is seen a schematic diagram of a structure of an integrated memory 10, which has memory cells MC in a memory cell array 1. The memory cells MC each contain a selector transistor TM and a storage capacitor CM. The storage capacitor CM in each memory cell MC is connected through the selector transistor TM to one of a plurality of column lines BLN. A control terminal of the respective selector transistor TM is connected to one of a plurality of row lines WLN. The memory cells MC are selected through the use of the respective selector transistor TM and the row lines WLN. In order to do this, the corresponding row line WLN is placed in an active state, so that the corresponding selector transistor TM is switched on. The column lines BLN are used to read or to write data signals which are stored in the storage capacitors CM.

The memory 10 also has row lines WLK and column lines BLK which are disposed in a region 2 of the memory chip. The region 2 is advantageously located on the periphery of the memory 10. The region 2 contains buffer capacitors CP, each having one respective terminal connected to one of the column lines BLK. The column lines BLK illustrated herein are each connected to a first potential V1 of a supply voltage. The respective buffer capacitors CP each have another respective terminal connected to a second potential V2 of the voltage supply. The buffer capacitors CP serve, in particular, to filter voltage peaks between the potentials V1 and V2. As a result, the dielectric strength of the memory 10 can be increased with respect to the potentials V1 and V2.

FIG. 3 shows a plan view of an embodiment of a memory according to the invention having buffer capacitors CP. The illustrated layout of the memory 10 in the region 2 is shown herein in a roughly diagrammatic manner. The buffer capacitors CP are each connected through a region GB to a contact K2. The contacts K2 in this case constitute an electrical connection to one of the column lines BLK. The contacts K2 are also referred to as CB contacts. The row lines WLK are not electrically connected to the regions GB. They are connected to the potential V1, as are the column lines BLK. The buffer capacitors CP are disposed in such a way that the respective connection or the respective region GB between the respective buffer capacitor CP and the contact K2 is disposed parallel to the respective row line WLK. In particular, a permanent operational reliability of the buffer capacitors CP is ensured because the contacts K2 and the buffer capacitors CP are not connected to one another through a selector transistor.

FIG. 4 shows a cross section through two buffer capacitors CP1 and CP2 which are contained in a region 2 according to FIG. 3. The buffer capacitors CP1 and CP2 are constructed as trench capacitors. This means that they are formed in a substrate SB of the memory through the use of a so-called trench. The buffer capacitors CP1 and CP2 are connected through respective regions GB1 and GB2 to the contact K2. The regions GB1 and GB2 constitute doped regions in the substrate SB. They form a diffusion series resistor between the respective buffer capacitors CP1 and CP2 and the contact K2.

The wiring of the buffer capacitors CP1 and CP2 according to FIG. 4 is shown schematically in FIG. 2. The diffusion series resistors formed by the regions GB1 and GB2 are modeled by respective resistors R1 and R2. The contact K2 is connected to an exemplary column line BLK0, which is itself connected to the potential V1. The substrate SB of the memory 10 is connected to the potential V2. In other words, the respective plate or node of the buffer capacitors CP1 and CP2 is connected to the potential V2. The potentials V1 and V2 are buffered with respect to one another through the use of the buffer capacitors CP1 and CP2.

The advantage of connecting the respective row lines WLK, column lines BLK and contacts K2 to the same potential V1 is that when there is a short circuit between lines, no leakage current can occur between these lines.

FIG. 5 shows a cross section through two memory cells MCi, MCj which are contained in a memory cell array having a structure according to FIG. 1. Storage capacitors CMi and CMj of the memory cells MCi, MCj are connected through respective selector transistors TMi and TMj to the contact K1. In this case, the contact K1 is connected to a column line BLNk. Control terminals Gi and Gj of the respective transistors TMi and TMj are connected to respective row lines WLNi and WLNj. The respective transistors TMi and TMj are switched on through the row lines WLNi and WLNj. As a result, the memory cells MCi and MCj are selected. The storage capacitors CMi and CMj have an identical geometric structure to the buffer capacitors CP1 and CP2 of FIG. 4. The transistors TMi and TMj have respective source regions Si and Sj and a common drain region D.

In the diagram according to FIG. 5, the row lines WLNi and WLNj run orthogonally with respect to the transistors TMi and TMj and orthogonally with respect to the connections between the storage capacitors CMi and CMj and the contact K1. A short circuit between the row lines WLNi and/or WLNj and the contact K1 or the respective column line BLNk can adversely affect the operational capability of the transistors TMi and TMj.

In the memory according to the invention, as shown in FIG. 3 in conjunction with FIG. 4, the connections between the respective buffer capacitors CP and the contacts K2 are disposed parallel to the respective row lines WLK. Therefore, continuous doped regions GB can be produced without any respective selector transistors. If the integrated memory has memory cells with the structure according to FIG. 5, the doped regions GB1 and GB2 according to FIG. 4 are advantageously constructed in a manner corresponding to the source and drain regions of the transistors TMi and TMj. For this reason, the transistors TMi and TMj can be manufactured in a common doping process.

We claim:

1. An integrated memory, comprising:
   a plurality of column lines and a plurality of row lines;
   memory cells each having a selector transistor and a storage capacitor connected through said selector transistor to one of said column lines, said selector transistor having a control terminal connected to one of said row lines;

buffer capacitors;

contacts each connected to another of said column lines; and connections each connecting a respective one of said buffer capacitors to one of said contacts, said connections each disposed parallel to another of said row lines.

2. The integrated memory according to claim 1, wherein said connections are doped regions connected between said buffer capacitors and said contacts.

3. The integrated memory according to claim 2, wherein said doped regions are embedded as corresponding doped regions of said selector transistors.

4. The integrated memory according to claim 1, including:
a terminal for a first potential connected to a number of said row lines and said contacts; and
a terminal for a second potential connected to said buffer capacitors.

5. The integrated memory according to claim 1, wherein said buffer capacitors and said storage capacitors have an identical geometric structure.

* * * * *